United States Patent
Aigner et al.

(10) Patent No.: US 6,357,299 B1
(45) Date of Patent: Mar. 19, 2002

(54) MICROMECHANICAL SENSOR AND METHOD FOR PRODUCING THE SAME

(75) Inventors: Robert Aigner; Thomas Bever, both of München; Hans-Jorg Timme, Ottobrunn, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/372,306

(22) Filed: Aug. 11, 1999

(30) Foreign Application Priority Data

Aug. 11, 1998 (DE) ......................................... 198 36 341

(51) Int. Cl.⁷ .............................. G01L 9/00; G01L 9/16
(52) U.S. Cl. ......................................................... 73/754
(58) Field of Search ........... 73/754, 755; 257/415–420; 438/148

(56) References Cited

U.S. PATENT DOCUMENTS

| | | |
|---|---|---|
| 5,146,435 A | 9/1992 | Bernstein |
| 5,677,560 A | 10/1997 | Zimmer et al. |

FOREIGN PATENT DOCUMENTS

| | | |
|---|---|---|
| DE | 3445774 A1 | 7/1985 |
| DE | 4318466 A1 | 12/1994 |
| DE | 19648424 C1 | 6/1998 |
| DE | 196 48 424 C1 | 6/1998 |
| DE | 19738177 A1 | 9/1998 |

OTHER PUBLICATIONS

"Fabrication of a silicon micromachined capacitive microphone using a dry–etch process", Y.B. Ning et al., Sensors and Actuators A 53, 1996, pp. 238–242 (No month).
Japanese Patent Abstract No. 2–90707 (Okamoto), dated Mar. 30, 1990.
Japanese Patent Abstract No. 2–105603 (Okamoto), dated Apr. 18, 1990.
Japanese Patent Abstract No. 08046446 A (Hiroshi), dated Feb. 16, 1996.

*Primary Examiner*—William Oen
(74) *Attorney, Agent, or Firm*—Herbert L. Lerner; Laurence A. Greenberg; Werner H. Stemer

(57) ABSTRACT

A micromechanical sensor integrated on a chip, includes a semiconductor substrate, an electronic circuit, a void, a diaphragm, a counterelectrode and valve openings connecting a volume of the void to its surroundings. The valve openings are directed toward an upper surface of the wafer, and the counterelectrode is a component part of a coating plane that extends over the entire chip surface, so that the electronic semiconductor circuit can be applied to the coating plane by known semiconductor technology. A method for producing the micromechanical sensor as well as a microphone or a pressure sensor having the micromechanical sensor, are also provided.

14 Claims, 2 Drawing Sheets

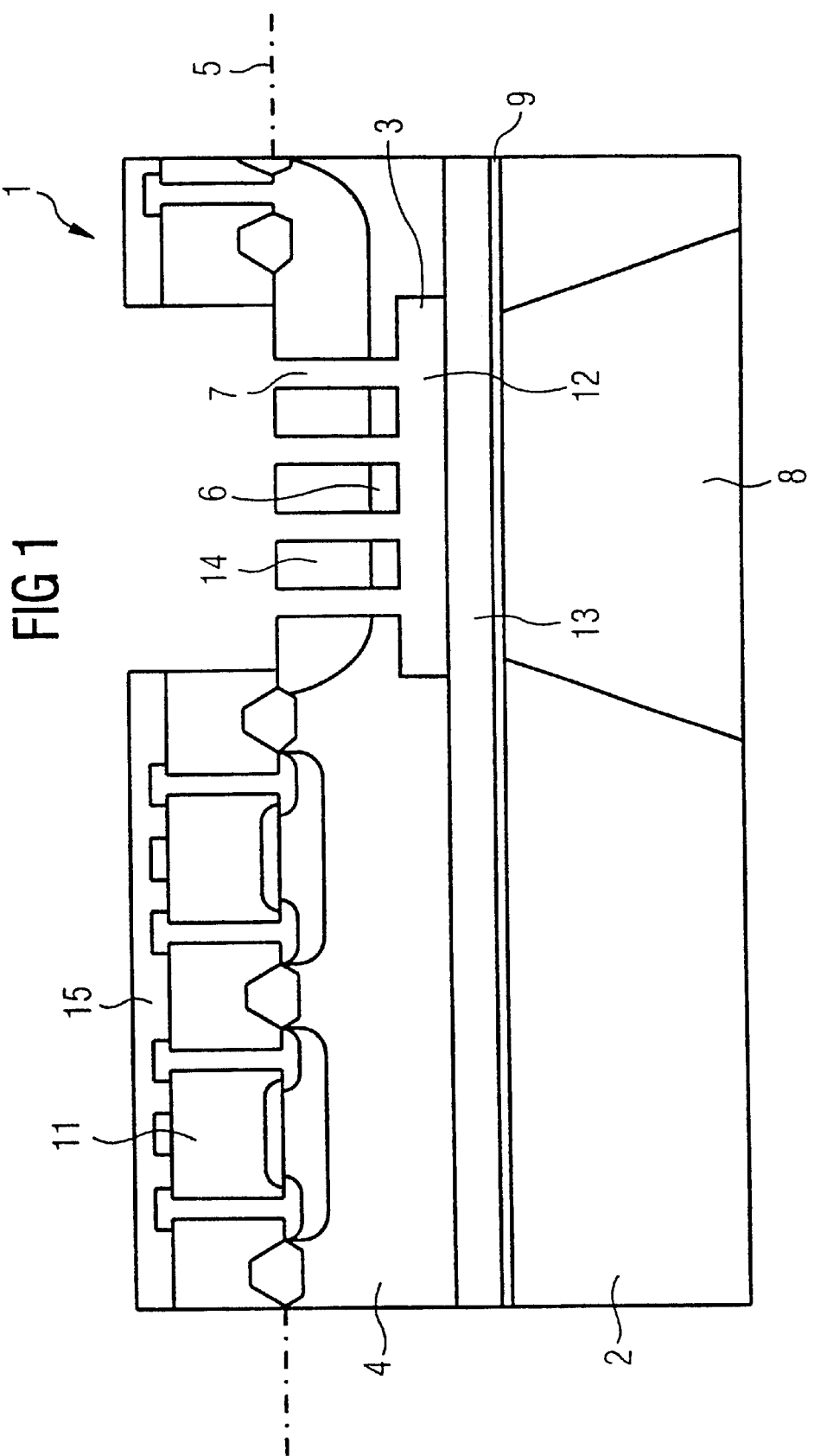

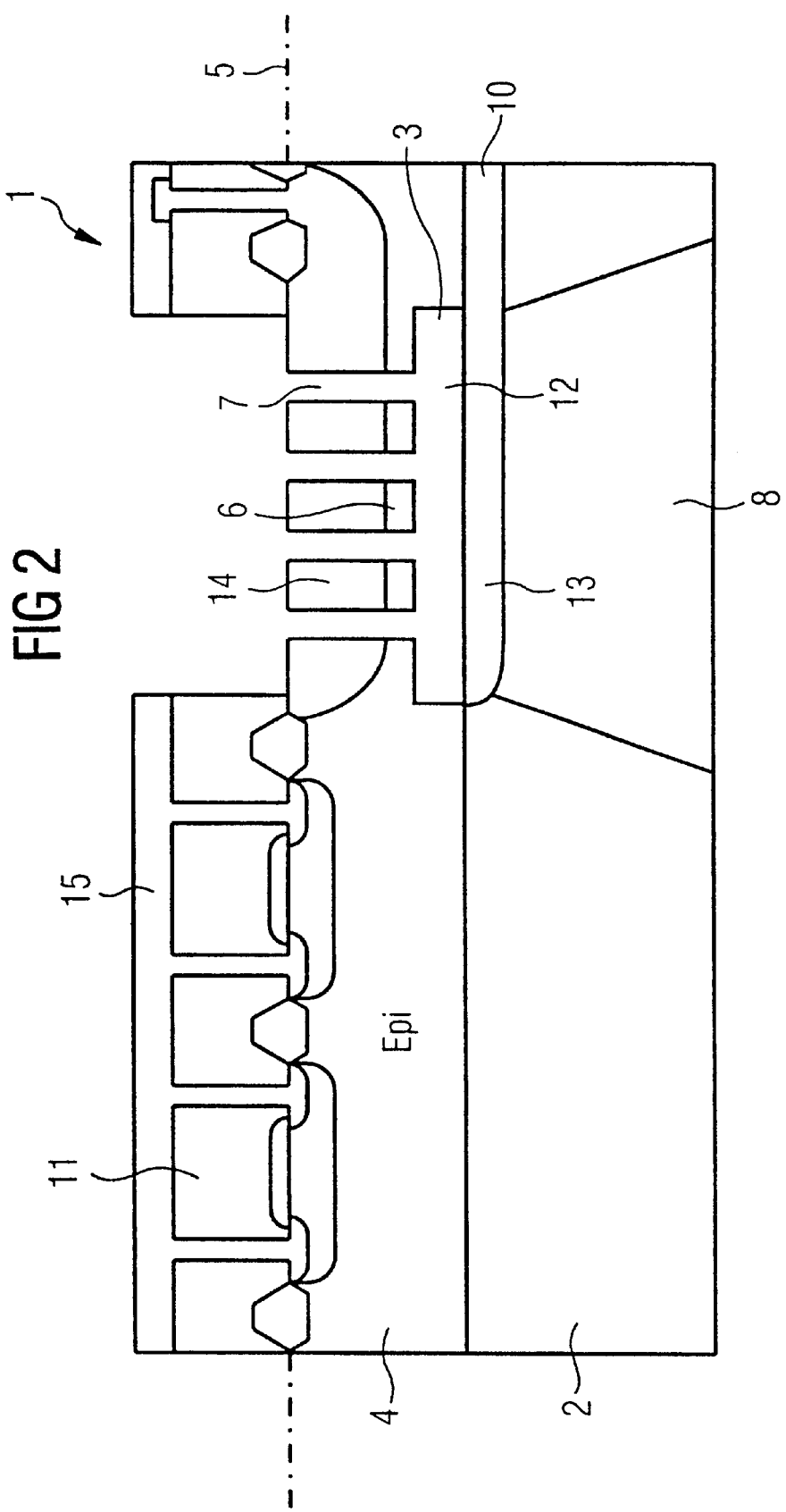

MICROMECHANICAL SENSOR AND METHOD FOR PRODUCING THE SAME

BACKGROUND OF THE INVENTION

FIELD OF THE INVENTION

The invention relates to a micromechanical sensor integrated on a chip, including a semiconductor substrate, an electronic circuit, a void, a diaphragm, a counterelectrode and valve openings connecting a volume of the void to its surroundings.

Highly miniaturized sensors are desired for certain applications, such as pressure sensors or microphones. Pressure differences or pressure fluctuations or acoustic oscillations can, for instance, be measured with the aid of the sensors.

A micromechanical sensor for applications and acoustics is described in U.S. Pat. No. 5,146,435. The sensor described therein includes a movable diaphragm and a supporting structure formed of a silicon wafer. A counterelectrode disposed above the web wafer protrudes past a wafer surface and forms a void between the diaphragm and the counterelectrode. The counterelectrode has valve openings on its upper surface, which communicate with its surroundings for the sake of air exchange with the void. The silicon wafer is removed below the movable diaphragm, so that the acoustical signal can reach the diaphragm. The principal by which the micromechanical sensor operates is based on a change in volume of the void, which causes a change in capacitance of the capacitor formed by the diaphragm and the counterelectrode. Electrical contacts are located on the upper surface of the wafer in order to measure the capacitance. No evaluation electronics are provided on the wafer.

German Patent DE 196 48 424 C1 describes a micromechanical sensor which can be used for pressure measurements and acoustic measurements. The sensor is constructed on an SOI (silicon oxide isolator) substrate and includes a diaphragm of polycrystalline silicon, which is disposed above a spacer layer on the substrate underlay. The spacer layer and the polycrystalline diaphragm form a void, and a counterelectrode is located in the region of the substrate on the opposite side of the diaphragm. The counterelectrode is thus disposed below the diaphragm. The diaphragm is located in the direction of the upper surface of the chip. In order to provide air equalization, valve openings are present which are aimed in the direction of the lower surface of the substrate. The polycrystalline diaphragm together with the other levels forms a chip surface that is not plane.

One disadvantage of the above-described structure for a micromechanical sensor is that the sensor cannot be produced in a simple way. Due to the diaphragm surface disposed at a distance from the substrate surface, the topology of the semifinished sensor during production is not suitable for applying a semiconductor circuit to it in a simple way. Manufacturing the circuit with a small number of process steps is therefore impossible.

Another disadvantage of the above-described configuration is that the diaphragm is formed of polycrystalline silicon. Polycrystalline silicon has unsatisfactory properties with regard to mechanical strength, which involves problems in manufacture, for instance. Thus the semifinished sensor element must be manipulated substantially more carefully, if damage to the vulnerable sensor surface is to be avoided. The production of known micromechanical sensors with a diaphragm oriented in the direction of the upper surface also has disadvantages. For instance, sacrifices in product quality can come about in mounting or when the wafer is sawn or diced apart, for instance.

SUMMARY OF THE INVENTION

It is accordingly an object of the invention to provide a micromechanical sensor and a method for producing the same, which overcome the hereinafore-mentioned disadvantages of the heretofore-known devices and methods of this general type.

With the foregoing and other objects in view there is provided, in accordance with the invention, a micromechanical sensor integrated on a chip having a chip surface, the sensor comprising a semiconductor wafer substrate having an upper surface; a void having a volume; a diaphragm; valve openings directed toward the upper surface of the wafer substrate and connecting the volume of the void to the surroundings; a counterelectrode forming part of a coating plane extending entirely over the chip surface, so that an electronic circuit can be applied to the coating plane by known semiconductor technology.

In accordance with another feature of the invention, the membrane is formed of monocrystalline material.

In accordance with a further feature of the invention, the counterelectrode is conductive or has a conductive layer.

With the objects of the invention in view there is also provided a method for producing a micromechanical sensor, which comprises a) producing a sacrificial layer in one region of a substrate surface of a semiconductor wafer substrate having a rear side; b) epitaxially growing a semiconducting material layer to create a planar layer protruding past the vicinity the sacrificial layer, and growing the semiconducting material layer in polycrystalline form in the vicinity of the sacrificial layer; c) optionally smoothing the planar layer; d) etching openings and filling the openings with a suitable material; and e) removing the material from the openings and the sacrificial layer, and etching the rear side of the wafer substrate for laying bare a diaphragm and creating a sensor opening.

In accordance with another mode of the invention, there is provided a method which comprises providing the wafer substrate with an oxide intermediate layer acting as an etching stop in the step of etching the rear side.

In accordance with a further mode of the invention, there is provided a method which comprises stopping the rear side etching by suitable doping of the wafer substrate.

In accordance with an added mode of the invention, there is provided a method which comprises applying a seed layer to the sacrificial layer after step a), the seed layer assuring improved growth conditions in the growth of the planar layer in step b).

In accordance with an additional mode of the invention, there is provided a method which comprises wet etching the rear side etching non-electrically or electrochemically, depending on the layer used for the etching stop.

In accordance with yet another mode of the invention, there is provided a method wherein the sacrificial layer and the material filling the openings are silicon oxide.

In accordance with yet a further mode of the invention, there is provided a method which comprises producing an electronic semiconductor circuit in a known manner after step d) and before step e).

With the objects of the invention in view there is additionally provided a microphone or pressure sensor having the micromechanical sensor.

Other features which are considered as characteristic for the invention are set forth in the appended claims.

Although the invention is illustrated and described herein as embodied in a micromechanical sensor and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view of a micromechanical sensor according to the invention, which has been made on an SOI substrate; and FIG. 2 is a view similar to FIG. 1 of a micromechanical sensor which has been made on a conventional silicon substrate.

DESCRIPTION OF THE PREFERRED EMBODIMENTS

Referring now to the figures of the drawings in detail and first, particularly, to FIG. 1 thereof, there is seen a micromechanical sensor 1. The production of the sensor is carried out in such a way that initially a sacrificial layer 3, preferably formed of silicon oxide, is applied on an SOI substrate 2, and then an epitaxial layer 4 is allowed to grow thereon. The thickness of the layer 4 is relatively much greater than the thickness of the layer 3, so that after this step the result is a plane surface 5. It may possibly be necessary for this surface to be polished to improve the smoothness. In general, the epitaxial layer 4 grows in monocrystalline form in the region of a wafer 2, while in the region of the material of the sacrificial layer 3, polycrystalline silicon 6 is created. In order to improve the quality of the epitaxial layer 4, a seed layer which may, for instance, be formed of polycrystalline silicon, can preferably be applied to the sacrificial layer 3. Subsequently, trenches 7 are etched into the epitaxial layer 4 in the usual way, creating channels that protrude as far as the sacrificial layer 3. These channels are then preferably filled with silicon oxide. Subsequently, as a structural characteristic that further defines the invention, an electronic semiconductor circuit 11 can be applied in the usual way to an upper surface 15 of the wafer by thin-film technology. This may, for instance, be a known CMOS, bi-CMOS, or bipolar process. Subsequently, the rear side of the substrate is etched in a currentless manner, for instance using KOH or TMAH, so that an opening 8 is created. The oxides in the channels and in the sacrificial layer are removed in a further etching step, which can be performed either after or before the rear side etching. This creates a void 12 which communicates with its surroundings through the channels 7. The channels 7 therefore preferably penetrate a counterelectrode 14. A diaphragm 13, which is created in the rear side etching, is made so thin that it can be induced to oscillate, for instance under the influence of a sound wave. The thickness of the diaphragm is preferably between 0.2 $\mu$m and 1 $\mu$m. It is possible to make the diaphragm 13 thinner in a bracing region, so that the oscillation can occur even at lesser sonic amplitudes. The diaphragm preferably has a total length in a range from 100 $\mu$m to 2000 $\mu$m. The rear side etching is expediently performed in a currentless manner, in particular with a KOH etching solution.

A production course that is modified over the above-described method is followed in order to produce the micromechanical sensor of FIG. 2. According to the method for producing the micromechanical sensor of FIG. 1, in the rear side etching the etching process is stopped by a silicon oxide layer 9. When an SOI wafer is used, this layer is automatically furnished by the wafer material being employed. The production of the sensor in FIG. 2 is accomplished without using an SOI substrate. First, before the layers 3 and 4 are grown, the substrate is provided with a suitable doping, which in the case of a p-wafer may be an n-dopant. A doped region 10 is preferably three-dimensionally limited. The doped region serves as an etching stop in the backside etching of the opening or void 8. Preferably, two methods are used for the backside etching:

a) the region 10 is highly doped with a suitable material, such as boron, and particularly with a dopant concentration of more than $10^{19}$ cm$^{-3}$. An n-wafer or a p-wafer is employed as the wafer. The etching of the void is carried out either with EDP (toxically), or with KOH, particularly in hot concentrated form, or with TMAH;

b) production of the region 10 with a weakly p-conductive or n-conductive doping having a dopant concentration in particular of less than $10^{15}$ cm$^{-3}$. A strongly p-doped or n-doped wafer is used as the wafer, with a dopant concentration that in particular is greater than $10^{18}$ cm$^{-3}$. The etching of the void is carried out electrochemically with HF or KOH.

The removal of the sacrificial layer 3 is preferably performed by wet etching.

The invention also pertains to the use of the sensor of the invention to produce pressure sensors, in particular relative pressure sensors, and microphones. In sensors for use in microphones, advantages are obtained if the diaphragm is disposed in the direction of an underside of a chip surface.

One substantial advantage of the configuration of the invention is that the diaphragm can be formed of monocrystalline material. This leads to improved mechanical resistance, in comparison to diaphragms of polycrystalline material. As compared with the method known from the prior art for producing micromechanical sensors, the production method of the invention can be performed in a simplified way. For instance, the production of intermediate layers, of the kind described, for instance, in German Patent DE 196 48 424 C1, can be dispensed with.

The method of the present invention furthermore offers the advantage of a planar chip surface. When circuits are produced on the chip of the sensor for instance, before or after the production of the sensor structure, the method steps are simplified by a planar chip surface.

We claim:

1. A micromechanical sensor integrated on a chip having a chip surface, the sensor comprising:

a semiconductor wafer substrate having an upper surface;

a void having a volume;

a diaphragm;

valve openings directed toward said upper surface of said wafer substrate and connecting said volume of said void to the surroundings;

a counterelectrode forming part of a coating plane extending entirely over the chip surface; and an electronic circuit applied to said coating plane by semiconductor technology.

2. The sensor according to claim 1, wherein said membrane is formed of monocrystalline material.

3. The sensor according to claim 1, wherein said counterelectrode is conductive.

4. The sensor according to claim 1, wherein said counterelectrode has a conductive layer.

5. A method for producing a micromechanical sensor, which comprises:
   a) producing a sacrificial layer in one region of a substrate surface of a semiconductor wafer substrate having a rear side;
   b) epitaxially growing a semiconducting material layer to create a planar layer protruding past the vicinity the sacrificial layer, and growing the semiconducting material layer in polycrystalline form in the vicinity of the sacrificial layer;
   c) etching openings and filling the openings with a material; and
   d) removing the material from the openings and the sacrificial layer, and etching the rear side of the wafer substrate for laying bare a diaphragm and creating a sensor opening.

6. The method according to claim 5, which comprises smoothing the planar layer.

7. The method according to claim 5, which comprises providing the wafer substrate with an oxide intermediate layer acting as an etching stop in the step of etching the rear side.

8. The method according to claim 7, which comprises stopping the rear side etching by doping the wafer substrate.

9. The method according to claim 5, which comprises applying a seed layer to the sacrificial layer after step a), the seed a layer assuring improved growth conditions in the growth of the planar layer in step b).

10. The method according to claim 7, which comprises wet etching the rear side etching with an etching step selected from the group consisting of non-electrical and electrochemical etching, depending on the layer used for the etching stop.

11. The method according to claim 5, wherein the sacrificial layer and the material filling the openings are silicon oxide.

12. The method according to claim 5, which comprises producing an electronic semiconductor circuit after step c) and before step d).

13. A microphone, comprising a micromechanical sensor integrated on a chip having a chip surface, the micromechanical sensor including:
   a semiconductor wafer substrate having an upper surface;
   a void having a volume;
   a diaphragm;
   valve openings directed toward said upper surface of said wafer substrate and connecting said volume of said void to the surroundings;
   a counterelectrode forming part of a coating plane extending entirely over the chip surface; and
   an electronic circuit applied to said coating plane by semiconductor technology.

14. A pressure sensor, comprising a micromechanical sensor integrated on a chip having a chip surface, the micromechanical sensor including:
   a semiconductor wafer substrate having an upper surface;
   a void having a volume;
   a diaphragm;
   valve openings directed toward said upper surface of said wafer substrate and connecting said volume of said void to the surroundings;
   a counterelectrode forming part of a coating plane extending entirely over the chip surface; and
   an electronic circuit applied to said coating plane by semiconductor technology.

* * * * *